(12) United States Patent
Wong

(10) Patent No.: US 6,288,577 B1
(45) Date of Patent: Sep. 11, 2001

(54) ACTIVE FAIL-SAFE DETECT CIRCUIT FOR DIFFERENTIAL RECEIVER

(75) Inventor: Anthony Yap Wong, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/681,237

(22) Filed: Mar. 2, 2001

(51) Int. Cl.[7] ................................................ H03K 5/22
(52) U.S. Cl. ................................................. 327/65; 326/14
(58) Field of Search .................................... 327/52, 63, 64, 327/65, 68, 70, 76–80, 82, 89, 90; 326/14

(56) References Cited

U.S. PATENT DOCUMENTS

| | | | |
|---|---|---|---|
| 4,297,599 | * 10/1981 | Werner et al. | 327/64 |
| 4,697,099 | 9/1987 | Bonaccio | 307/355 |
| 4,884,165 | 11/1989 | Kong et al. | 361/98 |
| 5,087,834 | 2/1992 | Tsay | 307/443 |
| 5,488,306 | 1/1996 | Bonaccio | 324/539 |
| 5,825,209 | 10/1998 | Stark et al. | 327/3 |
| 5,959,472 | 9/1999 | Nagamatsu et al. | 327/108 |
| 5,969,926 | 10/1999 | Whittaker | 361/101 |
| 5,977,796 | 11/1999 | Gabara | 326/86 |
| 6,054,876 | 4/2000 | Horie et al. | 326/83 |
| 6,111,431 | 8/2000 | Estrada | 326/83 |
| 6,124,727 | 9/2000 | Bridgewater, Jr. et al. | 326/33 |
| 6,130,548 | 10/2000 | Koifman | 326/21 |
| 6,130,795 | 10/2000 | Freitas et al. | 360/67 |
| 6,151,648 | 11/2000 | Haq | 710/107 |
| 6,188,264 | * 2/2001 | Masuta et al. | 327/316 |

OTHER PUBLICATIONS

Morgan & Smith, "The Active Fail–Safe Feature of the Sn65LVDS32B", 11/00, pp. 1–4.
"Data Transmission", Texas Instruments, pp. 4–18 and 4–19.
SN65LVDM179 Data Sheet, Texas Instruments, 12/98, pp. 1–19.

* cited by examiner

*Primary Examiner*—My-Trang Nuton
(74) *Attorney, Agent, or Firm*—Stuart T. Auvinen

(57) ABSTRACT

A fail-safe circuit for a differential receiver can tolerate high common-mode voltages. An output from a differential amplifier that receives a V+ and a V− differential signal can be blocked by a NOR gate when the fail-safe condition is detected, such as when the V+, V− lines are open. Pullup resistors pull V+, V− to Vcc when an open failure occurs. A pair of comparators receive a reference voltage on the non-inverting input. Once comparator outputs a high when the V+ line is above the reference voltage, and the other comparator outputs a high when the V− line is above the reference voltage. When both V+ and V− are above the reference voltage, the NOR gate blocks the output from the differential amplifier, providing a fail-safe. Since the reference voltage is very close to Vcc, a high common-mode bias can exist on V+, V− without falsely activating the fail-safe circuit.

19 Claims, 4 Drawing Sheets

ACTIVE FAIL-SAFE DETECT CIRCUIT FOR DIFFERENTIAL RECEIVER

BACKGROUND OF INVENTION

This invention relates to differential receivers, and more particularly to fail-safe circuits for low-voltage differential signaling (LVDS) receivers.

Electronic systems such as networking equipment often transmits signals over cables. Although the cables may be only a few meters in length, a transmission-line effect degrades data quality and transmission rate. Large signal swings also increases electro-magnetic interference (EMI) and system noise. To send signals over these cables, special drivers and receivers have been developed.

The problems of the transmission-line effect have been mitigated by using reduced voltage swings. Also, a pair of physical signals driven to opposite states are together used to transmit a single logical signal. Such differential signaling has been used with Emitter-coupled logic (ECL) for many years, and more recently in low-voltage differential signaling (LVDS) drivers and receivers.

LVDS drivers have a pair of outputs that are driven to opposite states. The two outputs are sent separately down the cable to the receiver, and at the far (receiver) end of the cable the lines are connected together by a terminating resistor. A current loop exists from one transmitter output, down the cable, through the terminating resistor, back up the cable to the other line's transmitter output. A voltage drop occurs across the terminating resistor that is sensed by the receiver. However, the voltage difference across the terminating resistor between the two signals is small, perhaps only a few hundred millivolts. Sensitive receivers are needed to detect such a small voltage difference between the two signal lines.

In real-life systems, cables can become disconnected, such as by a network technician when networks are modified, or when a cable fails. The transmitter can also fail or be in a high-impedance output state. At these times, neither output line is driven. The voltage across the terminating resistor drops to near zero. Noise can be coupled into the cable from various sources, and this noise can be picked up by the receiver's differential inputs and amplified. The output of the receiver can oscillate as the noise is amplified, and false triggering of receiver logic can occur.

To prevent such problems, fail-safe circuits have been employed. A simply fail-safe circuit uses resistors to connect the differential lines to power and ground. FIG. 1 shows a prior-art fail-safe circuit that connects the differential inputs to power and ground. Differential amplifier 10 receives a differential pair of input voltages V+, V−, and amplifies the voltage difference between V+ and V− to generate the output VO. Output VO typically is a digital signal driven fully to power and ground.

Sometimes differential inputs V+, V− are not driven by the transmitter, such as when a cable to the transmitter is disconnected, shorted together, or broken, or the transmitter is in a high-impedance state or is non-operational. When not being driven, signals V+, V− can float to indeterminate voltages, and noise can be coupled in. To prevent output VO from being in an indeterminate state, resistors 12, 14 are added.

Pullup resistor 12 connects differential input V+ to power, while pull-down resistor 14 connects differential input V− to ground. Resistors 12, 14 have a high resistance, such as hundreds of K-Ohms or more, to minimize any voltage shift to V+, V− during normal operation when driven by the differential transmitter. However, when lines V+, V− are floating, the small current from pullup resistor 12 causes line V+ to rise to the power-supply voltage Vcc, while pull-down resistor 14 produces a small current to pull line V− down to ground. When V+, V− are floating, resistors 12, 14 ensure that the inputs of differential amplifier 10 are in the 1, 0 logical state, so that output VO is driven high by differential amplifier 10.

Resistors 12, 14 have some unwanted disadvantages. When the cable fails by shorting together the two signals V+, V−, the fail-safe circuit does not function properly, since V+ and V− are shorted to the same voltage, and the small currents from resistors 12, 14 are not able to overcome the larger shorting current. Also, when a terminating resistor (not shown) is coupled between signals V+, V−, this resistor conducts so much more current than resistors 12, 14, that V+, V− have the same voltage despite resistors 12, 14. Resistors 12, 14 have resistances of many K-Ohms, while the terminating resistor has a resistance of only 100 Ohms. Thus using pullup and pulldown resistors are not effective with LVDS receivers, which use 100-Ohm terminating resistors.

FIG. 2 shows another prior-art fail-safe circuit. When a 100-Ohm terminating resistor 22 connects V+ to V−, the small current from resistors 12, 14 is insufficient to create enough voltage drop through terminating resistor 22. Series resistor 24 is added between V+ and the non-inverting input of differential amplifier 10, while series resistor 26 is added between V− and the inverting input of differential amplifier 10. The additional voltage drops through series resistors 24, 26 creates an additional voltage difference on the inputs to differential amplifier 10 when resistors 12, 14 supply the small current. This additional voltage difference on the input is enough to drive the VO output of differential amplifier 10 into a high state when a short occurs between V+ and V−.

Unfortunately, the addition of series resistors 24, 26 increases the R-C delay of the cable driving the inputs of differential amplifier 10. This additional delay can be significant and is undesirable. Also, the resistance values of series resistors 24, 26 must match precisely, or an unwanted voltage skew can be introduced that affects normal operation.

FIG. 3 shows a prior-art fail-safe circuit using an error-detection logic gate. When an open or a short occur on lines V+, V−, pullup resistor 12 pulls signal V+ high, while pullup resistor 32 pulls signal V− high. Since both lines V+, V− are pulled high by resistors 12, 32, no current flows through terminating resistor 22.

AND gate 30 is coupled to the inverting and non-inverting inputs of differential amplifier 10. When an open or short occurs and resistors 12, 32 pull both V+ and V− high, AND gate 30 detects the high-high condition on its inputs and outputs a high to OR gate 40. OR gate 40 drives its VO output high, since one of its inputs is high. The state of the input from differential amplifier 10 does not matter. Thus any indeterminate state of the output from differential amplifier 10 is masked by OR gate 40.

A problem can occur during normal operation of differential amplifier 10. When inputs V+, V− have a high common-mode voltage, AND gate 30 can read the high voltages on V+ and V− as highs, even though enough of a voltage difference exists between V+ and V− to properly operate differential amplifier 10. For example, when a 3-volt power supply is used, AND gate 30 may detect all input voltages above 2.3 volts as a high voltage. Signals V+, V− may swing between 2.5 and 2.9 volts, having a high common-mode voltage of 2.7 volts. When V+ is 2.5 volts and V− is 2.9 volts, differential amplifier 10 detects and outputs a low during normal operation. However, AND gate 30 sees both inputs V+ and V− above its logic threshold of 2.3 volts, and outputs a high. OR gate 40 then outputs a high despite the low from differential amplifier 10. Thus the correct outputs signal from differential amplifier 10 is blocked by the false triggering of the fail-safe circuit. Note that this example used a raised threshold of 2.3 volts, compared with the normal logic threshold of Vcc/2 or 1.5 volts. The problem is much worse for a normal-threshold AND gate.

What is desired is a fail-safe circuit for a differential receiver. A fail-safe circuit that does not add series resistors in the signal path is also desirable.

DETAILED DESCRIPTION

The present invention relates to an improvement in fail-safe circuits for differential receivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
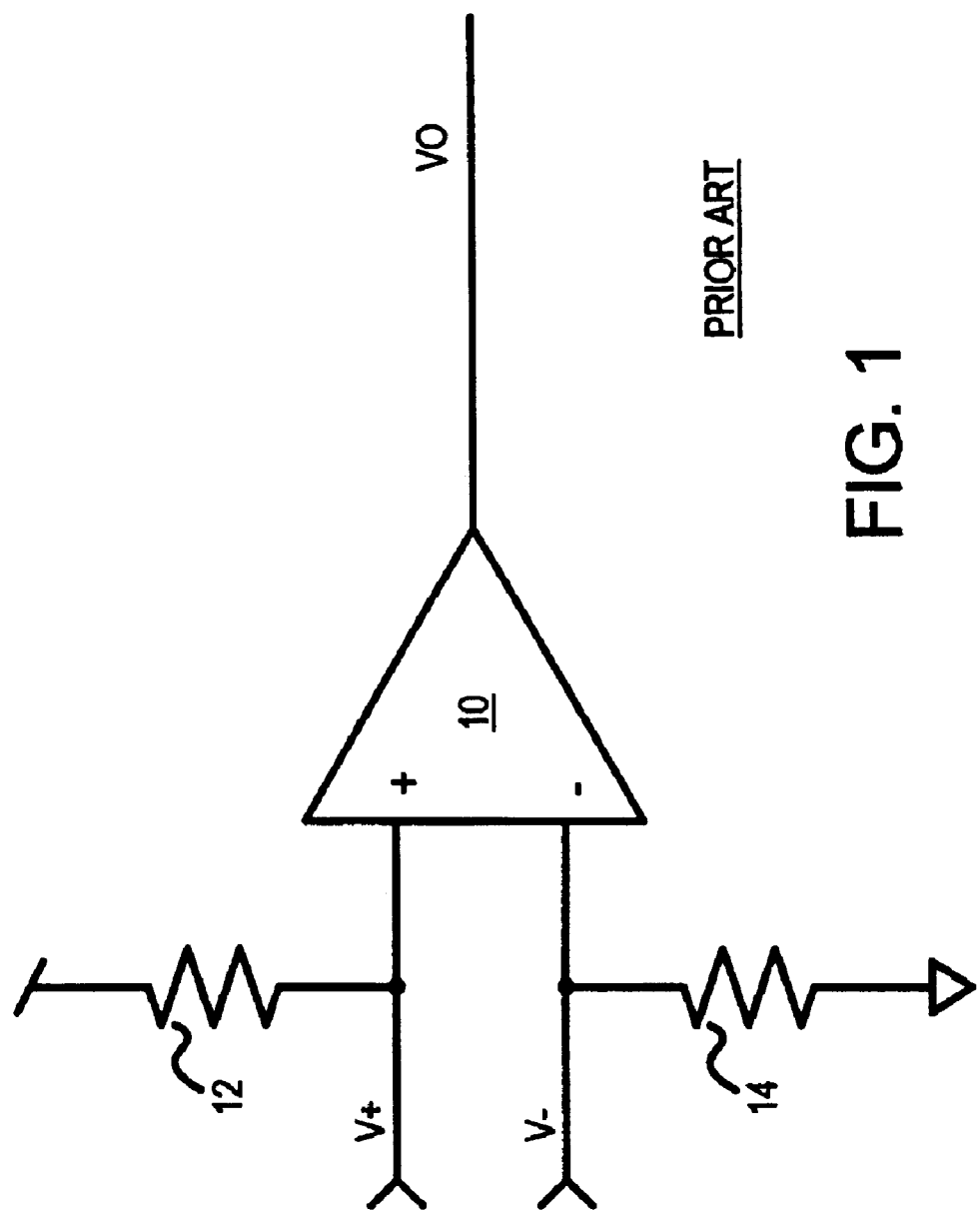
FIG. 1 shows a prior-art fail-safe circuit that connects the differential inputs to power and ground.
Figure 2:
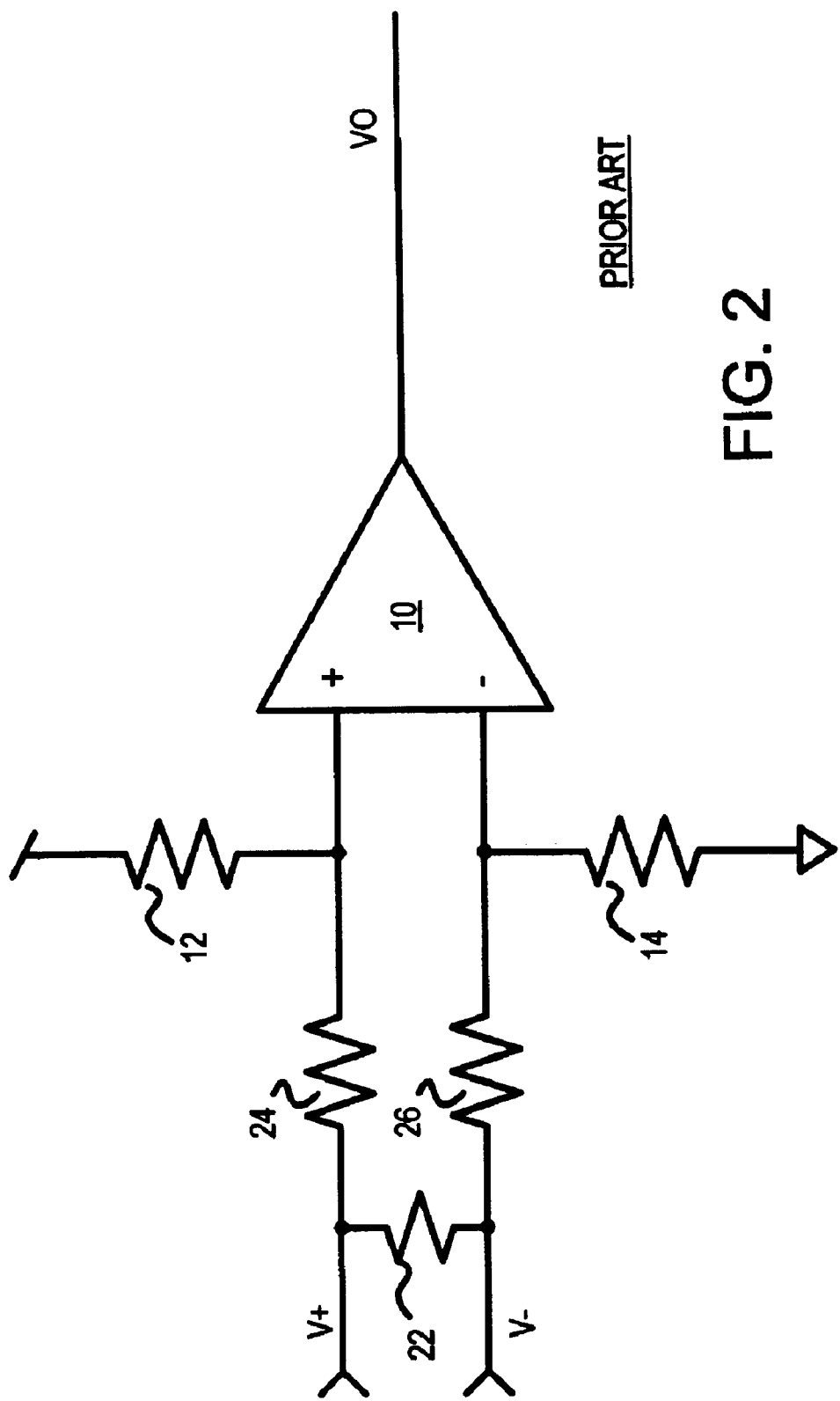
FIG. 2 shows another prior-art fail-safe circuit.
Figure 3:
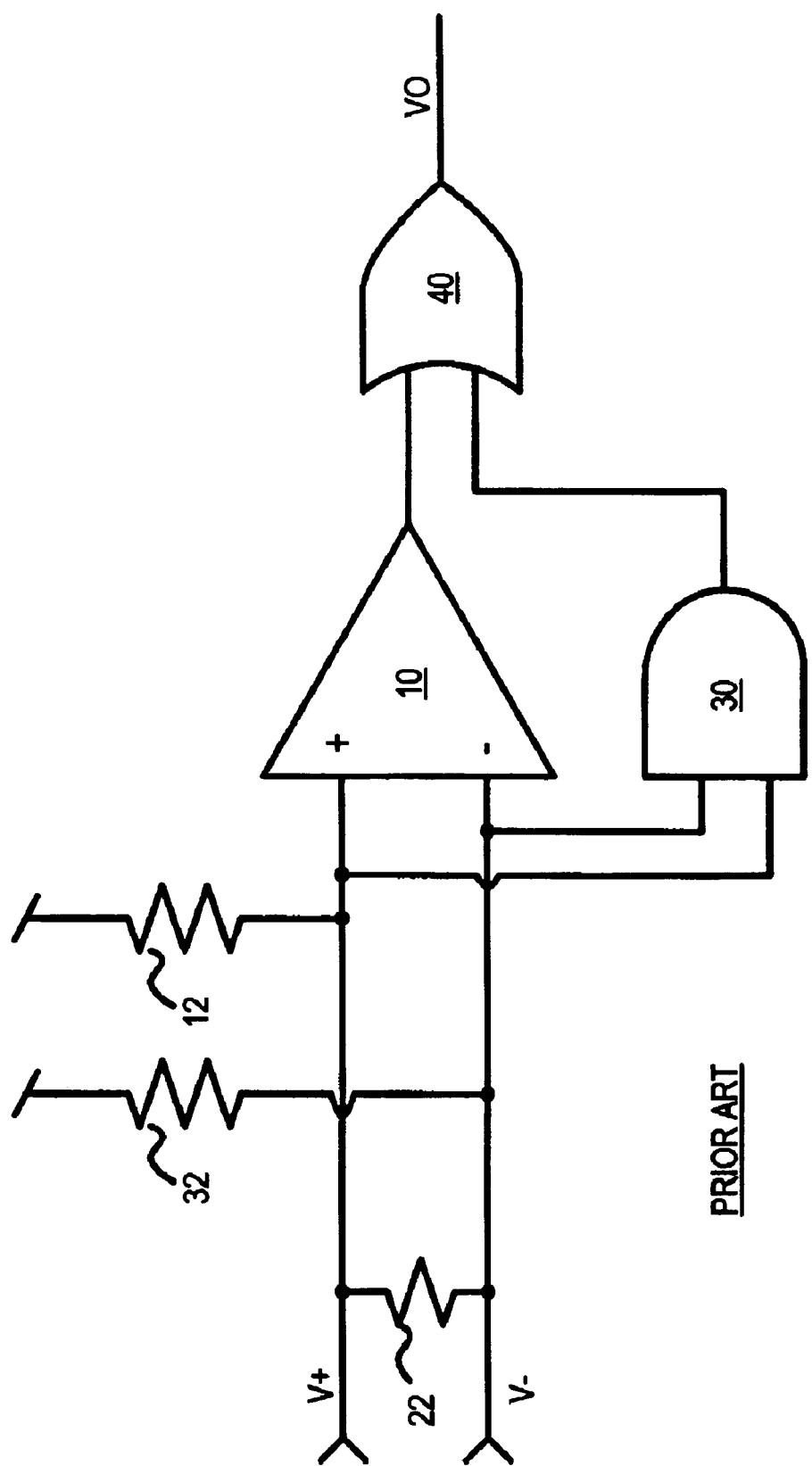
FIG. 3 shows a prior-art fail-safe circuit using an error-detection logic gate.
Figure 4:
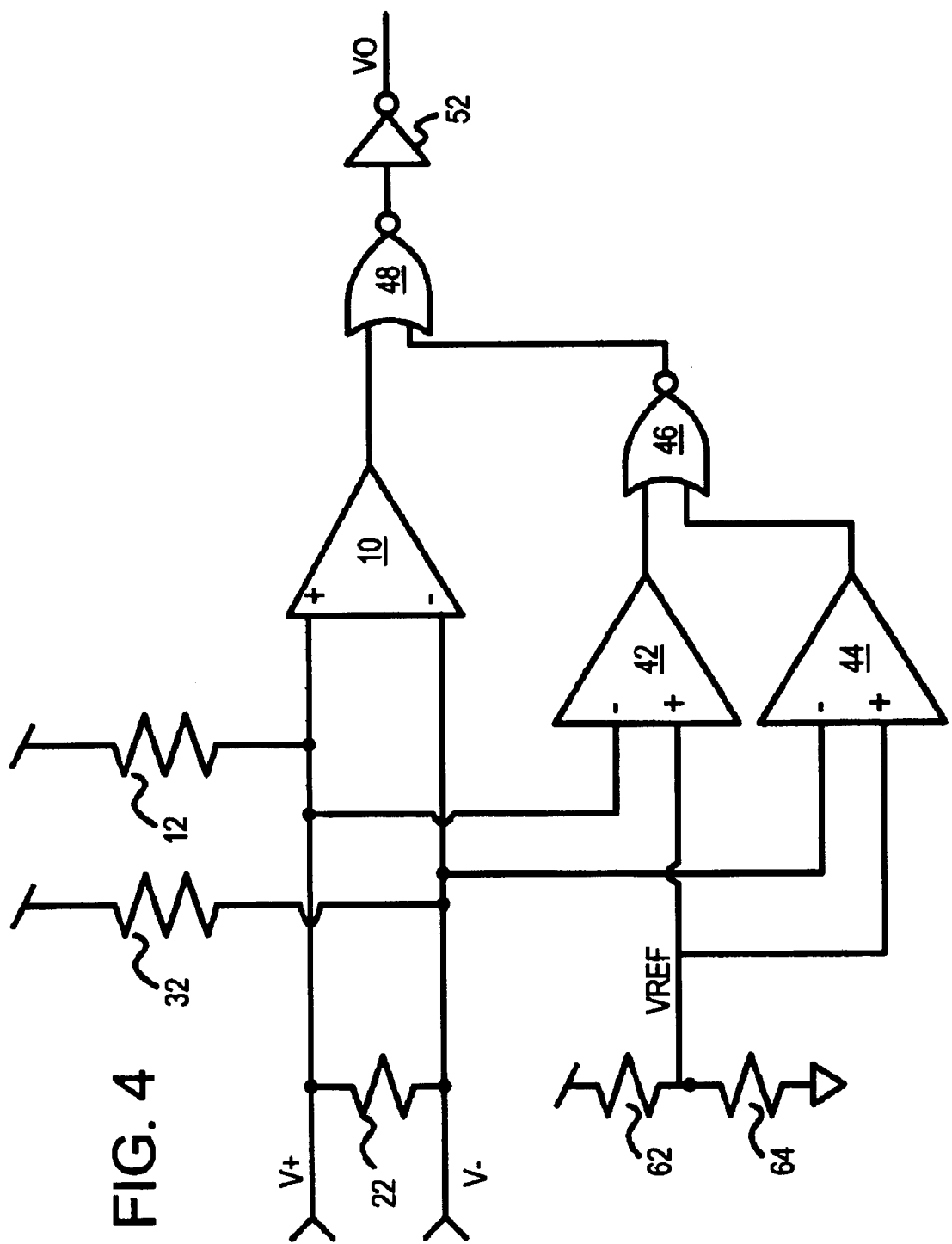
FIG. 4 is a differential receiver with a fail-safe circuit that can operate with a very high common-mode bias to the differential inputs.

FIG. 4 is a differential receiver with a fail-safe circuit that can operate with a very high common-mode bias to the differential inputs. A transmitter drives a current between V+ and V− which generates a voltage across load or terminating resistor 22. This voltage is detected by differential amplifier 10, which receives signals V+ and V− on its non-inverting and inverting inputs. In normal operation, the lower input to NOR gate 48 is low, so that the output from differential amplifier 10 is passed through NOR gate 48 and inverted by inverter 52 to generate output VO. Output VO is a digital signal such as a Transistor-Transistor-Level (TTL) signal that may be driven full-rail (to power and ground).

The differential signals V+, V− are applied to the inverting inputs of comparators 42, 44, respectively. The non-inverting inputs of comparators 42, 44 are driven by reference voltage VREF, which is very close to the power-supply voltage Vcc. Resistors 62, 64 form a voltage divider that generate VREF. The resistance of pull-up resistor 62 is much less than the resistance of pull-down resistor 64, so that VREF is 97% of Vcc, or 0.97*Vcc in this example. For a 3.0-volt Vcc, VREF is 2.91 volts. Of course, resistors 62, 64 can be adjusted to obtain other values of VREF near Vcc, but the best results are obtained when VREF is as close as possible to Vcc.

During normal operation, pullup resistors 12, 32 produce very small currents, since they have large resistance values such as 500 k-ohm. The current through terminating resistor 22 is much greater than these currents, so their effect is negligible.

One of V+, V− is low during normal operation. For example, when V+ is low, comparator 42 outputs a high, since VREF is above V+. When V− is low, comparator 44 outputs a high, since VREF is above V−.

Although one of V+, V− may be driven low, the other is driven high during normal operation. One or both of comparators 42, 44 outputs a high to NOR gate 46 during normal operation, which outputs a low to the lower input of NOR gate 48, allowing the output from differential amplifier 10 to pass through to output VO.

When a cable or transmitter interruption or failure occurs, such as an open on V+, V−, pullup resistors 12, 32 are able to pull signals V+ and V− up to Vcc, since no other currents are conducted from lines V+, V−. When both of signals V+, V− rise above VREF, comparators 42, 44 both output lows to the inputs of NOR gate 46. NOR gate 46 then outputs a high to the lower input of NOR gate 48, causing NOR gate 48 to ignore its upper input from differential amplifier 10 and output a low to inverter 52, which drives VO high. This is the fail-safe condition, when an indeterminate output from differential amplifier 10 is blocked.

Since VREF is 2.91 volts, both V+ and V− must rise above 2.91 volts to trigger the fail-safe state. Thus fail-safe is only signaled when both V+ and V− can be driven nearly all the way up to Vcc. This prevents false triggering of the fail-safe state.

During normal operation, the common-mode bias of signals V+, V− can be very high. As long as the common-mode bias is below VREF, fail-safe is not signaled. Thus the V+, V− lines can swing very close to Vcc and still not falsely trigger the fail-safe circuit. A common-mode bias of as much as 2.9 volt for a 3-volt Vcc can be tolerated. A very wide common-mode range is tolerated.

ALTERNATE EMBODIMENTS Several other embodiments are contemplated by the inventor. For example reference voltage VREF can be lowered somewhat, such as to 95% or 90% of the Vcc, when a narrower common-mode range is expected. Many different resistance values can be used, and the load or terminating resistor is normally selected to match the impedance of the V+, V− transmission lines, usually in the range of 50 to 120 Ohms. Various inversions in the logic can be introduced, and NAND gates rather than NOR gates can be substituted using DeMorgan's theorem. The inverting and non-inverting inputs to the comparators and the differential amplifier can be swapped to invert their outputs. Active-low signals rather than active-high signals can be substituted. Several gates can be combined into a larger gate, such as a 3-input AND or NAND gate. The output of NOR gate 46 can be used directly to set the differential amplifier output to a high state rather than going through NOR gate 48.

Pull-down resistors rather than pull-up resistors could be attached to the differential inputs, and a reference voltage near ground could be substituted, and the comparator inputs swapped.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A fail-safe differential receiver comprising:
   a pair of differential inputs that comprise a first differential input and a second differential input;
   a differential amplifier, receiving the first and second differential inputs, for generating a difference output;
   a first pullup resistor, coupled between a power supply and the first differential input;
   a second pullup resistor, coupled between the power supply and the second differential input;
   a first comparator, receiving the first differential input and a reference voltage, for generating a first compare signal;
   a second comparator, receiving the second differential input and a reference voltage, for generating a second compare signal;
   a combining gate, receiving the first and second compare signals, for generating a blocking signal;
   a first reference-generating resistor, coupled between the power-supply and a reference node for the reference voltage;
   a second reference-generating resistor, coupled between the reference node and a ground;
   wherein a resistance value of the first reference-generating resistor is at least 90% less than a resistance value of the second reference-generating resistor; and
   a blocking gate, receiving the difference output from the differential amplifier and the blocking signal, for driving a safe output to a fixed state when the first and second comparators activate the first and second compare signals, but for passing the difference output to the safe output when either the first compare signal of the second compare signal is not activated,
   whereby differential inputs are compared to the reference voltage to determine when to block the difference output from the differential amplifier.

2. The fail-safe differential receiver of claim 1 wherein the reference voltage is at
   least 90% of a power-supply voltage for the power supply, whereby a high common-mode bias to first and second differential inputs is tolerated without activating the blocking signal.

3. The fail-safe differential receiver of claim 2 wherein the reference voltage is at least 95% of the power-supply voltage.

4. The fail-safe differential receiver of claim 2 wherein the blocking gate and the combining gate are NOR gates.

5. The fail-safe differential receiver of claim 4 wherein the first comparator further comprises a non-inverting input that receives the reference voltage, and an inverting input that receives the first differential input, the first compare signal being activated when the first differential input has a voltage above the reference voltage;
   wherein the second comparator further comprises a non-inverting input that receives the reference voltage, and an inverting input that receives the second differential input, the second compare signal being activated when the second differential input has a voltage above the reference voltage.

6. The fail-safe differential receiver of claim 1 further comprising:
   a terminating resistor, coupled between the first and second differential inputs, for generating a voltage difference that is detected by the differential amplifier.

7. The fail-safe differential receiver of claim 6 wherein the terminating resistor has a resistance value of 50 to 150 ohms.

8. The fail-safe differential receiver of claim 7 wherein the first and second pullup resistors have resistance values that are at least a hundred times greater than the resistance value of the terminating resistor.

9. A differential receiver comprising:
   a first differential input;
   a second differential input;
   differential amplifier means, responsive to the first and second differential inputs, for generating a difference signal in response to a voltage difference between the first and second differential inputs;
   first compare means, coupled to the first differential input, for determining when the first differential input is outside of a voltage limit;
   second compare means, coupled to the second differential input, for determining when the second differential input is outside of the voltage limit;
   first reference-generating resistor means for generating a reference voltage, coupled between the power-supply and a reference node for the reference voltage;
   second reference-generating resistor means for generating the reference voltage, coupled between the reference node and a ground;
   wherein a resistance value of the first reference-generating resistor means is at least 90% less than a resistance value of the second reference-generating resistor means; and
   combining means, coupled to the first and second compare means, for blocking the difference signal from the differential amplifier means when both the first differential input and the second differential input are outside of the voltage limit;
   whereby the difference signal from the differential amplifier means is blocked when both the first differential input and the second differential input are outside of the voltage limit.

10. The differential receiver of claim 9 further comprising:
    first resistor means, coupled to the first differential input, for driving the first differential input to a fixed voltage when the first differential input is not driven by a transmitter;
    second resistor means, coupled to the second differential input, for driving the second differential input to a fixed voltage when the second differential input is not driven by a transmitter.

11. The differential receiver of claim 10 wherein the first reference-generating resistor means and the second reference-generating resistor means comprise a voltage limit means for generating the reference voltage, the reference voltage indicating the voltage limit.

12. The differential receiver of claim 10 further comprising:

load resistor means, coupled between the first and second differential inputs, for generating a voltage between the first and second differential inputs.

13. The differential receiver of claim 10 wherein the differential receiver is a low-voltage differential signaling (LVDS) receiver.

14. The differential receiver of claim 10 wherein the fixed voltage is outside the voltage limit compared by the first and second comparators.

15. The differential receiver of claim 14 wherein the first resistor means and the second resistor means are coupled to a power supply;

wherein the voltage limit is an upper limit.

16. A differential receiver with open-cable detection comprising:

a cable input having a first differential line and a second differential line;

a load resistor coupled between the first and second differential lines to generate a voltage difference;

a differential amplifier for amplifying the voltage difference across the load resistor, the differential amplifier receiving the first and second differential lines and generating a difference output; p1 a first resistor coupled to the first differential line, for driving the first differential line to a fixed voltage when the first differential line is open;

a second resistor coupled to the second differential line, for driving the second differential line to a fixed voltage when the second differential line is open;

a first comparator, receiving the first differential line and coupled to a reference node, for comparing a voltage on the first differential line to a reference voltage on the reference node and generating a first compare output;

a second comparator, receiving the second differential line and coupled to the reference node, for comparing a voltage on the second differential line to the reference voltage on the reference node and generating a second compare output;

a first reference-generating resistor, coupled between the power-supply and the reference node for the reference voltage;

a second reference-generating resistor, coupled between the reference node and a ground;

wherein a resistance value of the first reference-generating resistor is at least 90% less than a resistance value of the second reference-generating resistor; and blocking logic, receiving the first and second compare outputs and the difference output, for blocking the difference output and driving a final output with a constant signal when both the first and second differential lines are beyond a voltage limit determined by the reference voltage, but otherwise passing the difference output to the final output.

17. The differential receiver with open-cable detection of claim 16 wherein the blocking logic comprises:

a first gate, receiving the first and second compare outputs, for generating a blocking signal;

a second gate, receiving the blocking signal and the difference output, for generating the final output.

18. The differential receiver with open-cable detection of claim 17 wherein the second gate comprises a NOR gate and an inverter.

19. The differential receiver with open-cable detection of claim 18 wherein the fixed voltage is a power-supply voltage, and wherein the voltage reference is within 10% of the power-supply voltage.

* * * * *